SEMICONDUCTOR DEVICES AND CIRCUITS USING THE PINCH EFFECT

Original Filed Oct. 28, 1959 3 Sheets-Sheet 1

INVENTORS
Maurice Glicksman & Martin C. Steele

BY W. S. Hill
Agent

INVENTORS
Maurice Glicksman &
Martin C. Steele
BY W.S. Hill
Agent

Aug. 6, 1968 M. GLICKSMAN ET AL 3,396,283

SEMICONDUCTOR DEVICES AND CIRCUITS USING THE PINCH EFFECT

Original Filed Oct. 28, 1959 3 Sheets-Sheet 3

INVENTORS
Maurice Glicksman &
Martin C. Steele

BY W. S. Hill
Agent 3,396,283

SEMICONDUCTOR DEVICES AND CIRCUITS USING THE PINCH EFFECT

Maurice Glicksman and Martin C. Steele, Princeton, N.J., assignors to Radio Corporation of America, a corporation of Delaware Continuation of application Ser. No. 849,341, Oct. 28, 1959, which is a continuation-in-part of application Ser. No. 767,459, Oct. 15, 1958. This application May 7, 1965, Ser. No. 457,246

3 Claims. (Cl. 307—309)

This application is a continuation of U.S. patent application Ser. No. 849,341, filed Oct. 28, 1959, now abandoned, which is a continuation-in-part of U.S. application Ser. No. 767,459, filed Oct. 15, 1958, now abandoned, both by the applicants herein.

This invention relates to improved semiconductor devices and circuits therefor, which devices operate on the formation of an electron hole plasma in a semiconductor body. Such plasmas may be produced by impact ionization in the body. The devices and circuits of the invention are useful as high speed switches, amplifiers, oscillators, and the like.

Impact ionization diodes are known which sharply change their resistivity from a high to a low value in response to a small electric field. The effect has been observed in N and P-type germanium, and other semiconductor materials at very low temperatures, such as 4° Kelvin, for example. It is believed that the sudden change or "breakdown" in resistivity is due to impact ionization of electrons or holes from impurity centers in the energy bandgap of the semiconductor. This ionization process produces predominantly one type of free charge carrier, either free electrons or free holes. The impact ionization phenomenon with impurity centers is extremely rapid and therefore impact ionization diodes are useful as high speed switches among other things.

The semiconductor devices of the present invention operate on a different principle, that is the formation of an electrically neutral cloud of free electrons and free holes or electron-hole plasma in the semiconductor body. The devices herein may be formed of a body of semiconductor or insulator material which is either intrinsic, nearly intrinsic, or with impurities. The word "semiconductor" is hereinafter used to include semiconductors and insulators with or without impurities. A preferred device comprises a semiconductor body, for example N-type indium antimonide, with comparatively low electron concentration ($10^{14}$–$10^{15}$ per cc. at 77° K.). At room temperature this body is substantially intrinsic. If a relatively high electric field is applied to the body, on the order of 200 volts/cm., the resistivity of the device changes from a relatively high value to a relatively low value. This breakdown occurs at relatively high temperatures—liquid nitrogen (77° K.) and higher temperatures. The sudden change or "breakdown" in resistivity is believed to be due to an impact ionization process which creates electron-hole pairs across the forbidden energy bandgap of the semiconductor as opposed to the formation of one type of free charge carrier by impact ionization of impurity centers which have electronic states within the forbidden energy bandgap. Thus in the breakdown or ionization process produced in the devices herein, there exists an electrically-neutral cloud comprising equal proportions of free electrons and free holes in a matrix of the original electrons. A somewhat similar electrically-neutral cloud, but of free electrons and free positive ions, has previously been observed in gas and vacuum discharges and has been referred to as a "plasma." The electrically neutral cloud comprising free electrons and free holes described herein is referred to as an electron-hole plasma.

An electron-hole plasma may be generated by any of several different processes. It may be generated thermally simply by heating certain semiconductor or insulator bodies until they are intrinsic. It may also be generated by injecting equal proportions of both free charge carriers into the body; as from metal contacts, or from P-N junctions. It may be generated by the impact ionization phenomenon described in the foregoing paragraph. And, it may be generated by bombarding or irradiating the body with suitable light, electrons, nuclear particles, or similar energy units. In each case, equal and substantial proportions of free electrons and free holes are made to exist in the same region of the semiconductor or insulator body in addition to the original, equalibrium number of free carriers.

An object of this invention is to provide useful devices which operate upon the generation and control of an electron-hole plasma in semiconductor and insulator bodies.

A further object is to provide solid-state devices and circuits including the devices for amplifying or switching electrical signals through the generation and control of an electron-hole plasma.

A further object is to provide solid-state devices and circuits including devices for generating high frequency oscillations through the generation and control of an electron-hole plasma.

In the operation of the devices herein, an electron-hole plasma is produced in a semiconductor or insulator body by any of the above-described processes. An electric field applied to the semiconductor body produces a current flow through the body in the region where the electron-hole plasma is present. The current flow generates a self-magnetic field which, when it exceeds a critical value, constricts or "pinches" the electron-hole plasma in the body. This constriction or "pinching" of the electron-hole plasma effectively increases the resistance to current flow through the device. The greater the degree of pinch, the greater the effective resistance and the lower the current flow at a constant electric field.

The degree to which the electron-hole plasma is pinched may be modified by applying a magnetic field to the body. A unidirectional magnetic field applied in a direction transverse to the direction of current flow has substantially no effect on the degree of pinch of the electron-hole plasma. A unidirectional magnetic field applied in a direction substantially parallel to, and either in the same, or opposite, direction to that of the current flow reduces the degree of pinch of the electron-hole plasma; i.e., lessens the constriction of the plasma. A circular magnetic field applied in a direction substantially parallel to but opposite in direction to the self-magnetic field also reduces the degree of pinch of the electron-hole plasma. A circular magnetic field substantially parallel to and the same in direction as the self-magnetic field increases the degree of pinch of the electron-hole plasma.

The family of devices disclosed herein using the above-described pinch effect in semiconductor bodies may be used for a variety of functions. For example, devices of the invention may be used for amplification of electrical signals and for switching. Further, the forces producing the pinch of the electron-hole plasma described herein can give rise to high frequency oscillations of the free carriers in the plasma. When coupled to suitable microwave transmission means, the device may function as an absorber or as a generator-radiator of microwave energy.

The invention is described in greater detail in the following description and the accompanying drawing in which:

FIG. 1 is a schematic diagram of a simple circuit according to the present invention including a magnetic field applied to a semiconductor body in the direction of current flow therein, FIG. 2 is a graph showing some performance characteristics of the circuit of FIG. 1 with a magnetic field applied in a direction parallel to the direction of current flow in the semiconductor body, FIG. 3 is a graph showing additional performance characteristics of the circuit of FIGURE 1.

FIG. 4 is a graph showing some performance characteristics of a circuit similar to that of FIG. 1 except that the magnetic field is applied in a direction transverse to the direction of current flow in the semiconductor body, FIGS. 5 and 6 are schematic diagrams of other circuits according to the present invention, FIGS. 7, 9 and 10 are partially sectional, partially schematic views illustrating the operation of devices wherein the resistance due to the pinch of the electron-hole plasma in the semiconducting body may be varied by an applied circular magnetic field.

Similar reference characters are used for similar structures throughout the drawings.

Figure 1:
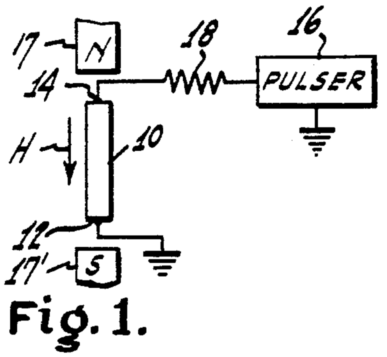

FIG. 1 is referred to first. Semiconductor body 10 is formed of N-type indium antimonide. The semiconductor is a bulk semiconducting crystal, that is, there are no junctions. The two contacts 12 and 14 to the body are ohmic. The circuit in series with the body includes a source of short pulses 16 and a utilization circuit or load illustrated schematically by a resistor 18. The crystal is immersed in a longitudinal magnetic field; that is, a magnetic field parallel to the direction of current flow in the device which is illustrated schematically by the arrow H. The longitudinal magnetic field is produced by permanent magnets 17, 17'. However, it is to be understood that an electromagnet may be used instead.

In a practical circuit, the crystal 10 may have a square cross section of 0.3 x 0.3 millimeter and a length of approximately 8 millimeters. The measured electron concentration at 77° Kelvin in a crystal used to check the performance of the circuit of FIG. 1 is approximately $2\times10^{14}$/cm.$^3$ before electron-hole pair creation. The mobility at 77° Kelvin, before electron-hole pair creation, is approximately $4\times10^5$ cm.$^2$/volt-second.

The circuit shown in FIG. 1 may be operated by maintaining the temperature of the crystal constant at 77° Kelvin. The reason for maintaining the crystal temperature constant is to prevent temperature variations from influencing other parameters; however, this is not essential to the invention and, moreover, the circuit may be operated at temperatures higher or lower than 77° Kelvin. As one example, the circuit may be operated at room temperature (about 300° K.).

Figure 2:
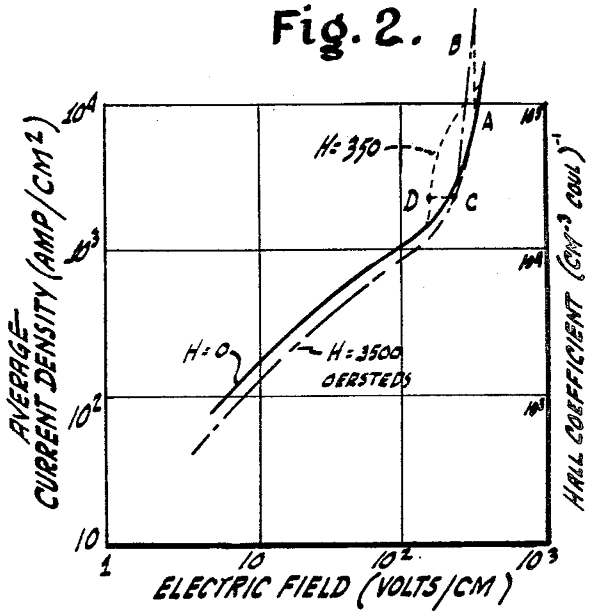

In operation, 1 microsecond pulses are applied to the crystal at a rate of about one pulse per second. The relatively low pulse repetition rate is to avoid excessive heating of the crystal. The solid line curve ($H=0$) in FIG. 2 shows the crystal performance under these conditions and in the absence of an applied magnetic field. The current may be determined from the voltage across the resistor 18 in series with the crystal 10 and the average current density may be calculated from the total current and the cross sectional area of the crystal 10. The amplitude of the voltage pulse across the resistor is preferably measured by a calibrated oscilloscope. The electric field across the crystal is measured by measuring the voltage across the crystal and the length of the crystal. It may be observed that the crystal exhibits a strong non-linearity at electric fields of the order of 200 volts/cm., indicating a sudden decrease in the crystal resistivity.

The dot-dashed curve ($H=3500$) of FIGURE 2 illustrates the circuit performance with a longitudinally applied magnetic field of 3500 oersteds. Note the sharper bend in the curves indicating a more rapid breakdown of the crystal in the presence of the longitudinal magnetic field.

Figure 3:
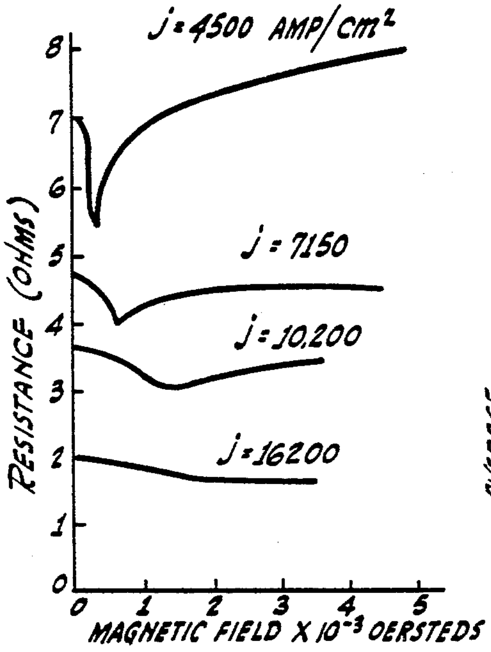

Other crystal parameters may be determined by applying various values of magnetic field while maintaining the current density through the crystal constant at successively increasing values. With the circuit operated in this manner, the curves of FIG. 3 are obtained. Note, in the upper two curves of FIGURE 3, the sharp decrease in resistance of the body 10 with increased magnetic field. The upper curve shows that, with the average current density maintained constant at approximately 4500 amps/cm.$^2$, the resistance of the crystal 10 sharply changes from approximately 7 ohms to approximately 5½ ohms when the applied magnetic field is varied from 0 to 300 oersteds, and then increases.

Figure 4:
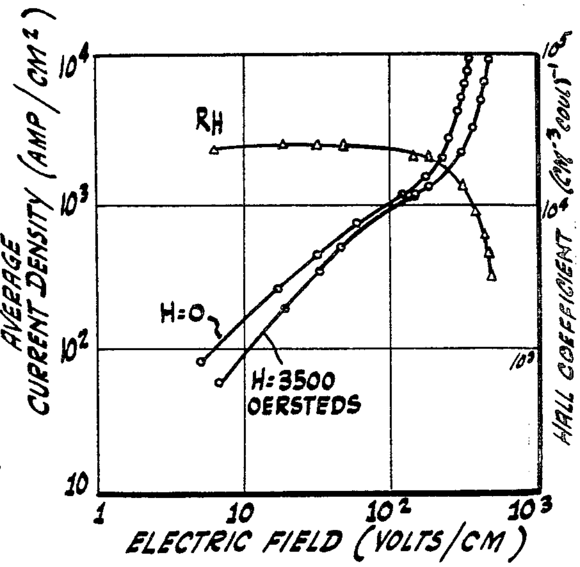

FIG. 4 shows the average current density-electric field characteristics of a circuit similar to the circuit illustrated in FIGURE 1 for no applied magnetic field ($H=0$) and for an applied transverse magnetic field of 3500 oersteds ($H=3500$). The Hall coefficient, $R_H$, is also shown as a function of the electric field, E, in the presence of a 3500 oersted transverse magnetic field. For E greater than about 150–200 v./cm., $R_H$ is seen to decrease rapidly for small further increases in E. This decrease evidences that electron-hole pairs are created by impact ionization across the forbidden gap. Other mechanisms that might have explained these results have been considered; however, the creation of the electron-hole pairs presently appears to be the most likely mechanism.

For $H=0$, that is, no magnetic field, the current density increases as $E^{4.0}$ in the region above about 240 v./cm. Although this is a rapid increase in current, it might have been expected to be even more rapid. It is believed that the shape of the current density-electric field curve is determined principally by the electron-hole scattering and recombination processes.

Referring again to FIGURE 2, in the sub-threshold region, the magnetoresistance is much less than for the corresponding transverse case, as is expected for the electrons with their isotropic effective mass. There are two other marked differences between the longitudinal and transverse magnetic field cases. In FIG. 2, the curve for $H=3500$ oersteds exhibits a near vertical rise in current density when $E=268$ v./cm. This near vertical rise is also observed for applied longitudinal magnetic field with values of $H=1050$ oersteds and 7000 oersteds, the onset electric field being a monotonically increasing function of the magnetic field. In FIGURE 2, for $H=350$ oersteds, the curve (a portion of which is shown dotted) undergoes a peculiar loop in the interval 150–260 v./cm. This loop is indicative of a resistance which decreases with increasing applied longitudinal magnetic field from zero to 350 oersteds.

To further analyze the foregoing curves, it is desirable to determine the effect of the applied magnetic field upon the average drift velocity of carriers. The product of the Hall coefficient and the current density gives the average drift velocity, $v_d$, of the electrons. Measurements of Hall coefficient and current density have been made at three values of applied transverse magnetic field, for $H=1050$, 3500, and 7000 oersteds. For $H=3500$ and 7000 oersteds the values of $v_d$ exhibited saturation for electric fields greater than 300 and 150 v./cm. respectively. For $H=1050$ oersteds $v_d$ was still increasing at $E=350$ v./cm. An average drift velocity of $5.4\times10^7$ cm./sec. can be compared to ½ the value of $v_m$, the velocity of a carrier having an energy sufficient to cause ionization. Using the criterion of Wolff P. A., Physical Review 95, 1415 (1954) of 1.5 $E_g$ (or 0.3 ev.), the average $v_m/2$ is $9.4\times10^7$ cm./sec. As is also believed to be the case in the avalanche effects in germanium and silicon, impact ionization is due to the electrons in the high energy tail of the distribution. In this model of the ionization process, a saturation in drift energy is expected due to the presence of the efficient inelastic electron-hole production process which serves as an energy sink.

The curves of FIGURE 2 for the device operating in an applied longitudinal magnetic field, rise more steeply than does the curve with no external magnetic field. Curve $H=0$ rises less steeply because, for current larger than 5 amperes, the current due to the electron-hole pairs is pinched down by the self-magnetic field. Thus, the electron-hole plasma occupies a geometrical space effectively much smaller than the cross-section of the sample. The curve of FIGURE 2 is not proportional to the current density, but is stretched in the direction of increasing ordinate to yield such a proportionality, i.e., the I–V curve is less steep that the $j$–V curve. Where the current carrying cross-section becomes very small, the density becomes large enough to give appreciable electron-hole scattering. In addition, there is appreciable magnetoresistance due to the large circular magnetic field. Both of these effects increase the electric field necessary to produce a given current density.

When a longitudinal magnetic field is applied, the pinch effect is reduced. The cross-section occupied by the electron-hole plasma is larger with an applied longitudinal magnetic field, and when the longitudinal field is about equal to the circular current-produced magnetic field, the pinch effect is effectively neutralized. The applied longitudinal magnetic field may be applied either in the direction of or opposite to the direction of current flow.

The pinched plasma current in the solid can be treated in a way similar to the situation in a gas. Such a treatment yields the following condition for a "steady state" pinched plasma with no applied magnetic field:

$$I \approx I_{cr} = \frac{2ck(T_e + T_h)}{ev.}$$

where $k$ is Boltzmann's constant, $c$ is the velocity of light in vacuum, $T_e$ and $T_h$ are the mean kinetic temperature of the electrons and holes in the plasma current, $v$ is the electron drift velocity and I is the current in electromagnetic units. When I approaches $I_{cr}$, the critical current, appreciable pinching will occur. In the 350 oersteds longitudinal magnetic field, currents of 10 to 15 amperes correspond to self-magnetic fields at the crystal surface of 110 to 165 oersteds. This appears to be sufficient to initiate pinching.

It is expected that the degree of the pinch in the absence of the longitudinal magnetic field is limited by a balance between the supply of electron-hole pairs and the loss through diffusion and recombination outside the pinch.

The operation of the device described with respect to FIGURE 1 involves pulses of 1 $\mu$sec. duration, with a rise time of the order of 0.1–0.2 $\mu$sec. Estimates of the time of contraction, using the results of Leontonvich and Osovets, Antomnaya Energiya 3, 81 (1956), yield about 0.01 $\mu$sec. This treatment ignores collisions, and thus gives a lower limit for this time. A simple estimate which includes the effects of scattering yields a value of about 0.1 $\mu$sec. for the crystal used. The period of quasistability of the pinch is estimated to be about 1 $\mu$sec.

The semiconductor device of FIG. 1 is a voltage-dependent resistance element which can be used to switch currents. If the voltage pulse applied to the crystal 10 produces an electric field lower than about 200 volts/cm., the current density is about 1,000 amps/cm.$^2$ or less. A small increase in voltage to a value greater than that required to produce the breakdown field will change the current density through the crystal by a factor of the order of 10—from approximately 1,000 amps/cm.$^2$ to upwards of 10,000 amps/cm.$^2$. An applied longitudinal magnetic field of about a few hundred oersteds or more greatly enhances the breakdown phenomenon. In other words, with the magnetic field applied, it requires a much smaller $\Delta E$, that is, change in electric field, across the crystal to produce the same change in current density through the crystal.

In a practical application, pulser 16 may represent a source which produces pulses of differing amplitudes some of which it is desired to switch and some not. Those pulses of an amplitude lower than that required to produce electron-hole pairs produce lower values of current through the crystal. Those of an amplitude sufficiently high to produce breakdown take advantage of the non-linear characteristic of the curve of FIG. 2. The change in current produced is orders of magnitude larger than would have been obtained with a linear device. Thus, the larger amplitude voltage pulses produce extremely sharp increases in current through the load and in this sense are switched.

Figure 5:
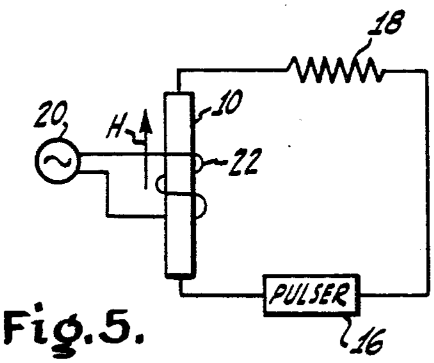

An embodiment of the invention which is useful as an amplifier is shown in FIG. 5. As in the circuit of FIG. 1, the indium antimonide crystal 10 is connected in series with a load 18 and pulses 16. The pulser produces preferably flat-topped voltage pulses having an amplitude greater than that required to produce impact ionization. The signal to be amplified is applied during the pulse period from a source 20 to the coil 22 wound on the crystal. Thus, the signal produces a longitudinal magnetic field as indicated by arrow H.

The effect of the magnetic field produced by the signal in the circuit of FIG. 5 may be understood from the curves of FIG. 2. In one mode of operation, the amplitude of the voltage pulses from pulser 16 is such that the circuit of FIG. 5 is operating at point A of FIGURE 2, curve $H=0$. When a signal from the source 20 is sufficiently strong to produce a longitudinal magnetic field of 3500 oersteds, the operation shifts to point B on the curve $H=3500$. Thus, the applied signal produces a sharp increase in current from point A to point B.

In a practical case, the signal amplitude is such that the magnetic field produced is substantially less than 3500 oersteds. However, with a properly chosen initial value of applied electric field (point A in FIG. 2) the effect is substantially the same.

The greater the number of turns of coil 22, the greater the magnetic field produced for a given signal amplitude. However, the greater the number of turns, the lower the frequency response which is possible. In the ideal case for relatively high frequency operation, the coil will have only one or two turns. With a one turn coil, operation up to frequencies of about 10 megacycles may be obtained.

FIG. 2 also illustrates the performance of the semiconductor with a lower value of longitudinal magnetic field (350 oersteds). It may be seen that this curve ($H=350$) becomes coincident with the $H=0$ curve at higher values of electric field.

Referring still to FIG. 2, if the current density is maintained at a fixed value greater than a given threshold value, and the magnetic field is increased, the resistance of the crystal decreases, passes through a minimum value and then begins again to increase. The decrease in resistance is shown at CD in FIG. 2 (since the current density is fixed and the electric field decreases as the magnetic field increases, this indicates a decrease in resistance). Further increases in magnetic field causes an increase in the resistance as shown in FIG. 3.

There are many practical applications for the devices of FIG. 5 (and 6). For example, the signal from the source 20 may be small amplitude pulses which are applied to the coil 22 during the application of the pulse from the pulser 16. The small pulse in this case is greatly amplified by the circuit and the pulse rise time is very short. The circuit is also useful as an "and" circuit. Here, the coincidental application of two pulses, the one applied by the pulser 16 in conjunction with the other pulse being larger than that required to produce breakdown, will give sharply increased current at load 18.

The devices described so far employ bulk semiconducing crystals and because of their relatively large lengths (≃1 cm.) require relatively high voltages to produce breakdown. However, the invention is also applicable to junction type semiconductor devices and these may be operated at much lower values of applied voltage. As one example, a P-N junction can be fabricated from indium antimonide by methods known in the art. One method includes diffusing zinc or cadmium into an N-type indium antimonide wafer (the wafer is doped with tellurium to make it N-type), thereby forming a P-type skin on the wafer. Subsequent masking and etching produces a P-N junction illustrated by the device 24 in FIG. 6.

With a semiconductor device of this type it is possible to create electron-hole pairs by sufficient voltage biasing in the reverse direction. The voltage drop in this case is across a very narrow region (of the order of $10^{-4}$ to $10^{-3}$ cm.) so that only a very small voltage is required to obtain an electric field of sufficient magnitude to produce band gap ionization. In a practical case, the voltage required may be of the order of a volt or less. If a longitudinal magnetic field is also applied to the device, the results achieved will be similar to those shown in FIG. 2.

Figure 6:
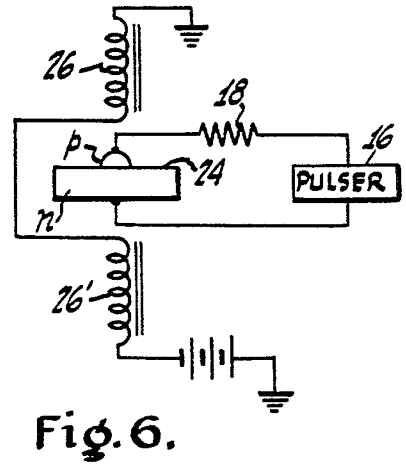

FIG. 6 includes also a circuit comprising a pulser 16 and a load 18 similar to those already described. The semiconductor device 24 includes a P-N junction (a zinc or cadmium doped indium antimonide dot alloyed to a tellurium doped indium antimonide wafer) and is connected in series with the load and pulser. The semiconductor device 24 is maintained at a temperature of 77° K. or lower. At higher temperatures, the particular dot and the wafer are both intrinsic or close to it and the semiconductor no longer operates as a P-N junction. The voltage pulses produced are of low amplitude, of the order of several volts, and these are sufficient to produce band gap ionization (breakdown) in the crystal. Note that the polarity of the pulses is such as to reverse bias the semiconductor device.

Electromagnet 26, 26' produces the longitudinal magnetic field in the circuit of FIG. 6. A permanent magnet may be used instead.

The circuit of FIG. 6 may be used as a fast switch. However, the breakdown phenomenon may also be used for amplification in a manner similar to that already discussed in connection with the circuit of FIG. 5. All that would be necessary would be to substitute for the bulk crystal 10 of FIG. 5 the P-N junction 24 of FIG. 6 and to adjust the operating parameters accordingly.

As has been pointed out earlier, electron-hole pair creation has been achieved with P-N junctions of germanium, silicon, germanium-silicon alloys, gallium arsenide and a number of others. The devices herein may be produced with any of the forgoing semiconductors.

Figure 7:
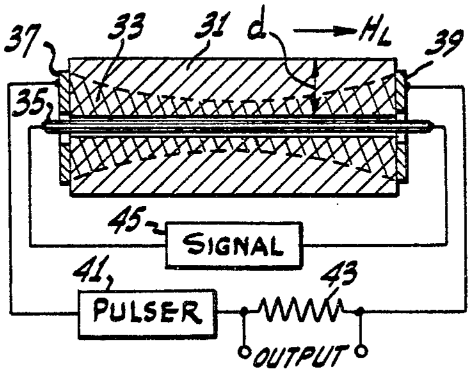
Figure 9:
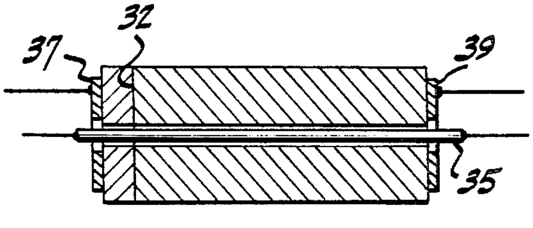
Figure 10:
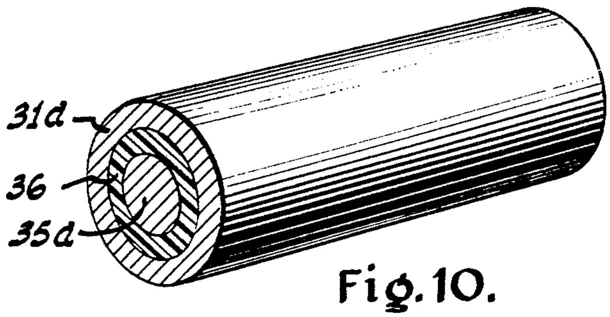

FIGS. 2 and 3 show that a longitudinal magnetic field may be used to alter the electric current flow in the devices herein. FIGS. 7, 9, and 10 illustrate devices in which a circular magnetic field may be used to control the degree to which the electron-hole plasma is pinched, and hence the amount of electric current flowing in the devices.

In FIG. 7, a single crystal 31 of indium antimonide is in the shape of a tube about 10 mm. long x 2.5 mm. in outer diameter. A hole about 0.5 mm. in diameter extends along the center line of the tube leaving a wall thickness dimension of $d$=1.0 mm. Ohmic contacts 37 and 39 are at the respective ends of the tube. The contacts 37 and 39 are connected in a series circuit to a means for generating a plasma in the crystal 31 including a pulser 41. Also in this series circuit is a load resistance 43 for deriving a voltage output from the device. A copper wire 35 about 0.4 mm. in diameter extends through the hole in the crystal 31. Both ends of the wire 35 are connected to a signal source 45. In this way, one has a four terminal device that can be used for switching, rectifying, or amplifying.

Figure 8:
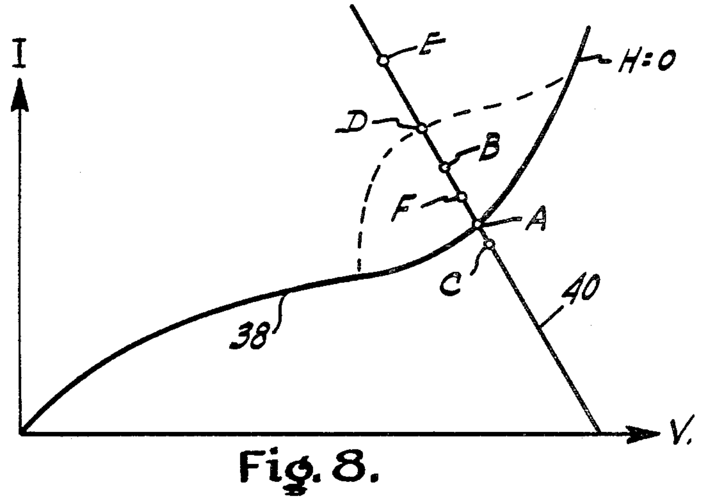
FIGURE 8 is an I–V curve illustrating the operation of the device of FIGURE 7.

FIG. 8 illustrates graphically the operation of the device of FIG. 7. The curve 38 is the I–V curve of the device of FIGURE 7 obtained with pulses from the pulser 41 of sufficient amplitude to produce an electron-hole plasma and with no current flowing in the wire 35.

The device may be operated as a rectifier in the following manner. A voltage pulse from the pulser 41 is applied to the contacts 37 and 39 of sufficient amplitude to generate an electron-hole plasma in the crystal 31 and to produce the current flow corresponding to the point A. The physical region of the electron-hole plasma under these conditions in the device is shown in FIG. 7 by the cross-hatch region 33. With the voltage pulse applied so that the device is at point A of the curve 38, an alternating current (AC) with an average current of 5 amperes is passed through the wire 35. Such an alternating current in the wire 35 generates an alternating circular magnetic field with an average value of about 100 oersteds at the surface of the crystal 31. For one half cycle, this field adds to the pinching self magnetic field and for the other half cycle subtracts from the pinching self magnetic field. During the additive half cycle, the current in the crystal 31 moves along the load line 40 from point A to point C and back, providing a relatively small charge in current. During the other half cycle, the operation shifts along the load line 40 from point A to point B and back, a relatively large change in current. The mode of operation is that of a rectifier whose frequency limitation is the time needed for the pinching to readjust itself. For indium antimonide, this time is about $10^{-8}$ seconds for a crystal having a dimension of 1 mm. for $d$.

For use as an amplifier, the device is operated so that the point of operation and the crystal 41 is at point D on the load line 40 of FIG. 8; that is, a magnetic field $H_L$ is applied to the device in addition to an electric field sufficient to produce a plasma in the crystal 31. Passing an alternating current through the wire 35, causes the device to operate between points E and F on the load line 40. The energy source for the amplification is the pulser 41. The frequency response of the device is in the hundreds of megacycles.

FIG. 9 illustrates a device similar in construction and operation to the device of FIG. 7 except that a P-N junction 32 is used to produce the plasma in the crystal 31. The method for producing a plasma for a P-N junction is described in connection with FIG. 6.

The device of FIG. 7 may also be built up from the wire 35 in the following manner, as illustrated in FIGURE 10. A copper wire 35a is treated to provide on its outer surface a thin insulating layer 36. This layer 36 may, for example, be achieved by coating silica on the wire surface. Then, a layer 31a of indium antimonide or any other appropriate semiconductor is evaporated over the silica to the desired thickness. The operation of the device of FIG. 10 is similar to that of the device of FIG. 7.

Figure 11:
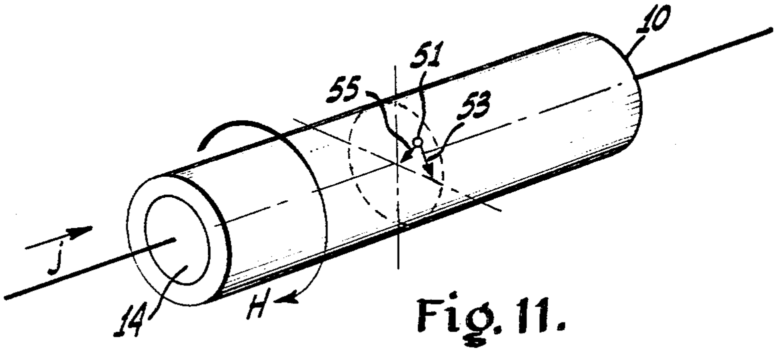
FIGURE 11 is a partially sectional, partially schematic view of a device herein illustrating the generation of high frequency oscillation by using the self-magnetic field generated in the devices herein.

FIG. 11 illustrates the manner in which high frequency oscillations of the free charge carriers in the electron-hole plasma of the crystal 10 as in FIGURE 2, are generated by the self magnetic field genertaed by an electric current flow through the crystal. A crystal 10 of indium antimonide has an electron-hole plasma generated in its bulk in the manner heretofore described, resulting in a current flow $\vec{j}$ which generates a self magnetic field H which is circular around the crystal. A typical free charge carrier 51 in the crystal 10 is acted upon by the magnetic field H with a force F in the radial direction shown by the arrow 55 toward the center of the crystal 51. The charge carrier 51 moves toward the center of the crystal 10, overrides the center and passes to the opposite side where it is again forced toward the center of the crystal 10 by the self magnetic field H, which always forces the carrier to the center of the body. The greater the self magnetic field, the higher the oscillation frequency.

The generation of high frequency oscillations of free charge carriers is analyzed in more complete detail as follows. Considering a conductor of cylindrical symmetry with a radius $a$, which carries a current of current density $j$ amperes/cm.$^2$, the self magnetic field will be $H$(in oersteds)$=\frac{2}{10}\pi jr$ at a distance $r$ (cm.), where $r$ is less than $a$, from the center. This magnetic field creates a Lorentz force $$F=\frac{e}{c}\cdot v.H$$

in which $e$ is the charge on a free carrier in esu and $v$ is the longitudinal velocity of the particles in cm./sec. The equation of motion in the transverse direction $r$ for a carrier having an effective m* is:

$$m^*\frac{d^2r}{dt^2}=\frac{-e}{c}v\frac{2\pi}{10}jr$$

which have solutions of harmonic oscillator type of frequency as follows:

$$\omega_h=\sqrt{\frac{2\pi evj}{10cm^*}}$$

This frequency $\omega_h$ is controllable through control of $v$ and $j$, both through the velocity directly, and through changing the density of carriers. The changing density of carriers has been demonstrated in the semiconducting indium antimonide, requiring low electric fields (200 v./cm.), and is feasible at temperatures of 77° K., 232° K. or higher. The changing of carrier density allows simple modulation of the oscillation frequency by modulating the DC current through the crystal, The cylindrical shape was chosen for simplicity of discussion. Rectangular shapes would give the same results qualitatively.

In the above treatment, if the current is being carried only by electrons, neutrality being mantained by either fixed charges or much heavier holes, there is another force of importance: that due to the electric field caused by the displacement of the charges. This electric field gives rise to electron-hole plasma oscillations of frequency $$\omega_p=\frac{c}{v}\omega_h$$

Actually, the equations of motion are modified by adding a term $$\frac{d^2r}{dt^2}=-\omega_h^2r-\omega_p^2r$$

and in this case the frequency of oscillation will be $$\omega\sqrt{\omega_h^2+\omega_p^2}$$

Since $\omega_h<\omega_p$, the oscillations will be of the electron-hole plasma type. However, if the current is being carried by both electrons and holes, the holes being of comparable mass to the electrons, the oscillations of electron-hole plasma type will be impelled by a smaller force, since the displacement of the electrons will be cancelled by the displacement of the holes, giving no net electric field if these are identical. Thus, the magnetic induced oscillations would be possible in such a material. The ideal materials for this effect would then be semiconductors or two-carrier metals with comparable effective masses—possible good examples being germanium and bismuth.

It is also necessary that the oscillation frequency of the carriers be larger than $1/\tau$, the scattering frequency, so that the carriers can make an appreciable number of oscillations before being scattered. Using appropriate values for InSb with carrier concentrations of about $10^{15}$ per cm.$^3$, we get about $10^{10}$/sec. for $\omega$. Under appropriate conditions, some materials have $1/\tau$ in the range of $10^{10}$ sec.$^{-1}$ so that this condition should not be a strong restriction.

The phenomenon of oscillations produced by the self magnetic field described above may be used to amplify, radiate, attenuate, or absorb microwave energy. The devices for accomplishing these functions are tunable or controllable by an applied DC signal or by an externally applied magnetic field which adds to or subtracts from the self magnetic field herein.

Figure 12:
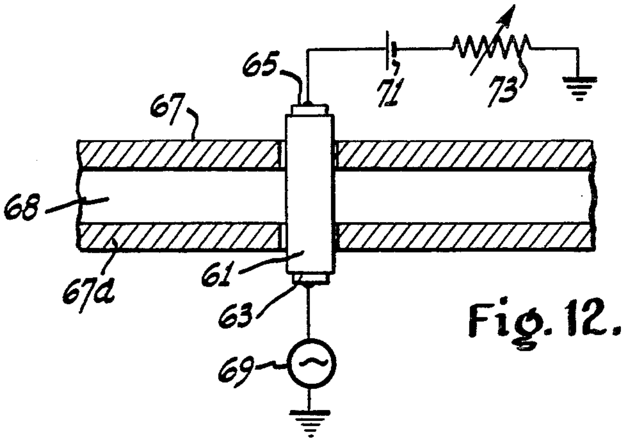
FIG. 12 is a partially sectional, partially schematic view of the device of FIGURE 11 in combination with a microwave coupling device.

As shown in FIGURE 12, a typical microwave device comprises a single crystal 61 of indium antimonide 5 millimeters long and 2 millimeters in diameter having nonrectifying contacts 63 and 65 attached to the ends thereof. The crystal 61 is inserted transversely in and insulated from a waveguide comprising two parallel conductors 67 and 67*a* separated by air or other insulator 68. The ohmic contacts 63 and 65 of the device extend beyond the waveguide 67.

What is claimed is:

1. In combination, a body selected from the group consisting of semiconductors and insulators having an electron-hole plasma therein, said electron-hole plasma including substantially equal numbers of electrons and holes, means to apply an electric field to said body of a magnitude to produce in said body a self-induced magnetic field of an intensity to pinch said plasma toward the center of said body, said means being operated to apply an electric field to said body of a magnitude sufficient to produce a current through said body exceeding the value $$I=\frac{2ck(T_e+T_h)}{ev}$$

where $k$ is Boltzmann's constant, $c$ is the velocity of light in vacuum, $T_e$ and $T_h$ are the mean kinetic temperatures respectively of the electrons and holes in the plasma current, $v$ is the electron drift velocity, $e$ is the constant corresponding to the charge on the electron, and I is the current in electromagnetic units, and means to apply a second magnetic field to said body to control the amount by which said plasma is pinched.

2. In combination, a body of semiconductor material, means to apply an electric field to said body of a magnitude to produce in said body an electron-hole plasma and a self-induced magnetic field of an intensity to pinch said plasma in a direction from opposite surfaces of said body toward the center of said body, said plasma including substantially equal numbers of electrons and holes, said means being operated to apply an electric field to said body of a magnitude sufficient to produce a current through said body exceeding the value $$I=\frac{2ck(T_e+T_h)}{ev}$$

where $k$ is Boltzmann's constant, $c$ is the velocity of light in vacuum, $T_e$ and $T_h$ are the mean kinetic temperatures respectively of the electrons and holes in the plasma current, $v$ is the electron drift velocity, $e$ is the constant corresponding to the charge on the electron, and I is the current in electromagnetic units, and means to apply a second magnetic field to said body to control the amount by which said plasma is pinched.

3. In combination, a body of semiconductor material, a pair of ohmic contacts positioned on said body, a source of pulses and an output load device connected in series between said contacts for applying to said body an electric field of a magnitude to produce in said body an electron-hole plasma and a self-induced magnetic field of an intensity to pinch said plasma in a direction from opposite surfaces of said body toward the center of said body, said plasma including substantially equal numbers of holes and electrons, said electric field having a magnitude sufficient to produce a current through said body exceeding the value $$I=\frac{2ck(T_e+T_h)}{ev}$$

where $k$ is Boltzmann's constant, $c$ is the velocity of light in a vacuum, $T_e$ and $T_h$ are the mean kinetic temperatures respectively of the electrons and holes in the plasma current, $v$ is the electron drift velocity, $e$ is the constant corresponding to the charge on the electron, and I is the current in electromagnetic units, and means to apply an externally produced magnetic field to said body to control the amount by which said plasma is pinched and therefore to determine the amplitude of said pulses required to produce an output pulse at said load device by the production of said electric field and said self-induced magnetic field in said body.

References Cited

UNITED STATES PATENTS

| | | | |
|---|---|---|---|
| 2,649,569 | 8/1953 | Pearson | 307—88.5 |
| 2,736,822 | 2/1956 | Dunlap | 307—88.5 |
| 2,869,001 | 1/1959 | Welker | 307—88.5 |
| 2,909,679 | 10/1959 | Abraham | 307—88.5 |
| 2,928,056 | 3/1960 | Lampert | 307—88.5 |
| 2,979,668 | 4/1961 | Dunlap | 307—88.5 |
| 2,987,659 | 6/1961 | Teszner | 307—88.5 |

FOREIGN PATENTS

| | | |
|---|---|---|
| 1,112,433 | 11/1955 | France. |

ARTHUR GAUSS, *Primary Examiner.*

D. D. FORRER, *Assistant Examiner.*